United States Patent
Huang et al.

(10) Patent No.: US 7,259,628 B2
(45) Date of Patent: Aug. 21, 2007

(54) SIGNAL DEPENDENT BIASING SCHEME FOR AN AMPLIFIER

(75) Inventors: Yunteng Huang, Irvine, CA (US); Susumu Hara, Austin, TX (US)

(73) Assignee: Silicon Laboratories Inc., Austin, TX (US)

(*) Notice: Subject to any disclaimer, the term of this patent is extended or adjusted under 35 U.S.C. 154(b) by 42 days.

(21) Appl. No.: 11/171,818

(22) Filed: Jun. 30, 2005

(65) Prior Publication Data

US 2007/0001764 A1 Jan. 4, 2007

(51) Int. Cl.
*H03F 3/45* (2006.01)

(52) U.S. Cl. ........................ 330/261; 330/254

(58) Field of Classification Search ............. 330/261, 330/253, 254, 9, 278, 277

See application file for complete search history.

(56) References Cited

U.S. PATENT DOCUMENTS

| | | | | |
|---|---|---|---|---|
| 3,617,916 | A | * 11/1971 | Smith | 330/255 |
| 3,806,823 | A | * 4/1974 | Marek | 330/261 |
| 4,528,515 | A | * 7/1985 | Gross | 330/254 |
| 6,178,213 | B1 | 1/2001 | McCormack et al. | 375/355 |
| 6,463,109 | B1 | 10/2002 | McCormack et al. | 375/355 |
| 6,630,868 | B2 | 10/2003 | Perrott et al. | 331/17 |
| 6,657,488 | B1 | 12/2003 | King et al. | 330/9 |
| 6,741,846 | B1 | 5/2004 | Welland et al. | 455/260 |
| 6,856,206 | B1 | 2/2005 | Perrott | 331/25 |
| 2004/0232995 | A1 | 11/2004 | Thomsen et al. | 331/2 |

FOREIGN PATENT DOCUMENTS

WO  WO2004/100380 A1  11/2004  ........... 7/23

OTHER PUBLICATIONS

Si5010—Product Brief. Silicon Laboratories. Dec. 2004.
"Data conversion in SONET/SDH systems", A. Muhlschein. Electronics Engineer. Jun. 2000.
"PFC Multipliers How The Translinear Multiplier Works" Dennis L. Feucht. 2002. http://www.innovatia.com/Design_Center/PFC%20Multipliers.htm. Accessed May 27, 2005.
"A 5-Gb/s 0.25µm CMOS Jitter-Tolerant Variable-Interval Oversampling Clock/Data Recovery Circuit". Lee, Sang-Hyun; Moon-Sang Hwang, Youngdon Choi, Sungjoon Kim, Young-June Park, and Gijung Ahn. *IEEE Journal Of Solid-State Circuits*, vol. 37, No. 12, pp. 1822-1830, Dec. 2002.
"Rate-Independent CDR Chip Locks In At Up To 2.7 Gbits/s". Mannion, Patrick. *Electronic Design*. www.elecdesign.com. Mar. 20, 2000.
OC-48 Optical Networking Solutions—Solutions Guide. Silicon Laboratories. May 2003.
Si5022/23 Multi-Rate Sonet/SDH CDR IC with Integrated Limiting Amplifier—Product Brief. Silicon Laboratories. May 2001.

* cited by examiner

*Primary Examiner*—Henry Choe
(74) *Attorney, Agent, or Firm*—Trop, Pruner & Hu, P.C.

(57) ABSTRACT

In one embodiment, the present invention includes an apparatus having a first amplifier stage to receive an input voltage and to provide an amplified output voltage at an output terminal, where the first amplifier stage is controlled by a first bias current. The apparatus may further include a second amplifier stage coupled to receive a control voltage and to provide an offset voltage to the output terminal, where the second amplifier stage is controlled by a second bias current. The first and second bias currents may be controlled by a single bias controller.

24 Claims, 6 Drawing Sheets

SIGNAL DEPENDENT BIASING SCHEME FOR AN AMPLIFIER

FIELD OF THE INVENTION

The present invention relates to amplifiers, and more particularly to controlling the biasing of an amplifier.

BACKGROUND

Amplifiers are used in many applications to amplify an incoming signal into an amplified signal. For example, amplifiers are often used in communication systems to boost the level of an incoming signal and sometimes to shape the signal in some desired way. Certain communication systems transmit data with a clock embedded in a data stream, rather than as a separate signal. When the data stream is received, a clock and data recovery circuit (CDR) recovers the embedded clock and retimes the received data to the recovered clock. Oftentimes, a CDR is implemented in an integrated circuit along with additional components, such as a limit amplifier (LA) and other such components. The LA may receive a voltage signal from a transimpedance amplifier (TIA) or other amplifier, which amplifies an incoming converted optical signal.

The function of the limit amplifier is to produce a consistent waveform from the TIA output which can be used by the CDR, regardless of incoming optical energy. In addition to amplifying the input signal, the LA may provide an adjustable slicing level to compensate for an asymmetric noise characteristic present in the incoming data. A slicing level is the threshold voltage at which an incoming signal is determined to be either a "1" bit or a "0" bit. At low levels of optical energy (e.g., corresponding to a zero bit level, for example), the noise current is low. At higher levels of optical energy (corresponding to a one bit), the noise current may be higher. An optimal slice level for an amplifier in a receive path can enhance receiver performance significantly, especially in long-haul applications. Thus an offset is typically inserted into the receive path, either at an input of an amplifier or at an output thereof.

The offset voltage, referred to as a slice voltage in certain applications, is often applied to be summed with the input of an amplifier. This offset voltage may be used to compensate for a slice level at which an amplified signal is to be sampled. Accordingly, the output of an amplifier may correspond to the sum of the input voltage and offset voltage, multiplied by the gain of the amplifier.

Figure 1A:
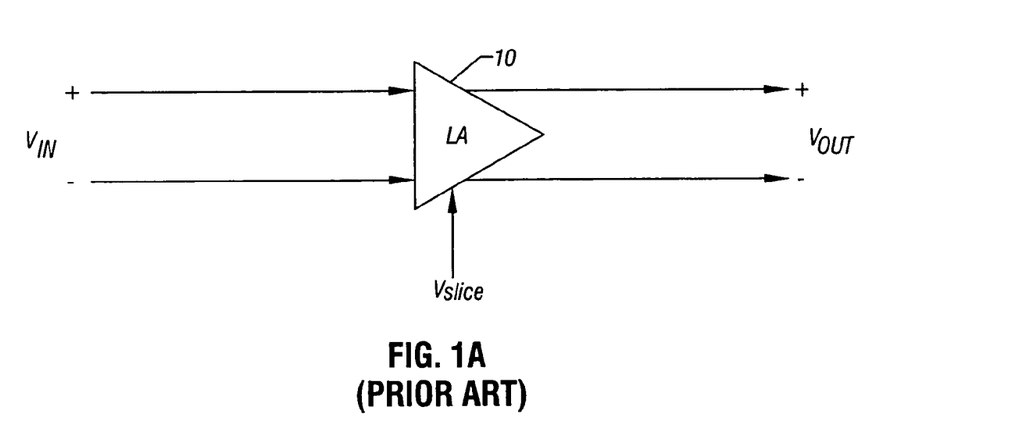
FIG. 1A is a block diagram of a limit amplifier.

Referring now to FIG. 1A, shown is a block diagram of a limit amplifier 10 that receives an incoming voltage, $V_{in}$, along with a slice voltage, $V_{slice}$, and provides an amplified output signal, $V_{out}$. The output voltage of amplifier 10 may be described in accordance with the following equation:

$$V_{out}=(V_{in}+V_{slice})\times GAIN_{LA} \quad (\text{Eq. 1})$$

where $GAIN_{LA}$ is the gain of limit amplifier 10. While limit amplifier 10 is shown in FIG. 1A as a differential amplifier, a single-ended implementation is also possible. Further, while the slice voltage is shown as a single-ended input, this voltage may also be a differential signal.

Figure 1B:
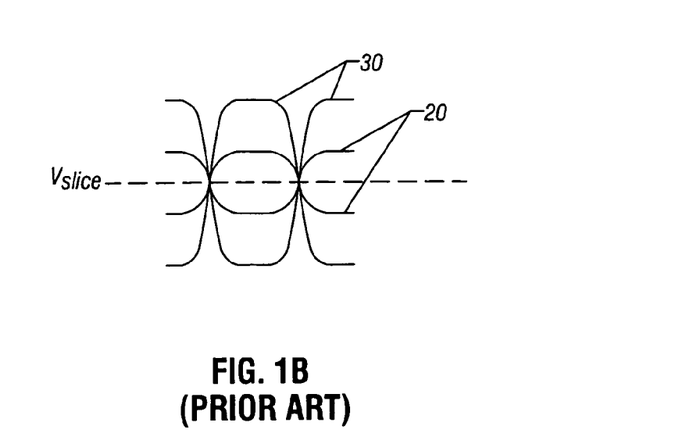
FIG. 1B is an eye diagram of data incoming to and output from a limit amplifier.

Optical signals are single-ended in nature. That is, a logic one value provides light, while a logic zero signal is dark. There is asymmetry in "1" and "0" signals when they are converted into the electrical domain, creating an asymmetrical data eye pattern. FIG. 1B is an eye diagram of a typical incoming data signal at an input of a LA and an amplified version appearing at the output of the LA. As shown in FIG. 1B, a data eye 20 corresponding to the incoming data is formed by superimposing waveforms of multiple data signals.

As shown in FIG. 1B, an output data eye 30 corresponding to the signal at the output of a LA is clipped at the top and bottom via the limit amplifier. Further shown in FIG. 1B is a slice voltage, $V_{slice}$, which corresponds to a widest opening of the eye pattern. The slice voltage may be adjusted depending upon the incoming signal to maintain the slice level at a widest portion of the eye pattern.

In the real world, data signals forming a data eye have transitions with varied rise times and fall times and may also exhibit different voltage levels and shapes. Thus a slicing level may be selected or controlled to obtain an output data eye with its widest opening and a relatively symmetric margin between the positive swing voltage and the negative swing voltage. To achieve the desired output signal, an introduction of an intentional offset may be effected, to optimize noise margin and hence achieve a lower bit error rate (BER).

Typically, this offset or slice voltage is proportional to the magnitude of the input voltage. A limit amplifier is a highly non-linear device, as the purpose of a limit amplifier when used, for example, in an optical system is to produce a clipped output such that a downstream device (e.g., a CDR) can easily process the data signal. Accordingly, the gain of the limit amplifier is not constant; for a small input voltage the gain is large, while for a large input voltage the gain is small.

It is desirable to generate a slice voltage that is at a low noise level, as noise in this slice voltage is amplified in the same manner as the input voltage. Typically, slice control is implemented by adding a slice amplifier stage to a signal amplifier signal stage in the limit amplifier. Both amplifier stages are generally controlled using independent fixed bias currents. Noise present in the output signal of the amplifier may originate in various sources, including circuitry that provides the input voltage, for example, a photodiode and a transimpedance amplifier that convert incoming optical energy into electrical signals. Furthermore, noise can be generated by the components of the signal amplifier stage as well as the slice amplifier stage. Still further, circuitry that generates a control voltage that is used to generate the slice voltage can also lead to noise.

In order to reduce noise contribution from the slice amplifier stage, typically the transconductance (gm) of the devices in the slice amplifier stage are much smaller than the transconductance of the devices in the signal amplifier stage. Because the bias currents remain fixed, so too does this transconductance ratio remain fixed.

Furthermore, because the signal swing range of a slice voltage is limited by the linear range of the slice amplifier stage and the available voltage swing of the control voltage, the achievable slice range is compromised, resulting in a less than satisfactory slice control range. For example, it is common for a slice range to be limited to approximately 20% of the incoming signal strength. In actual terms, this slice level is often limited to 100 millivolts (mV) or less in an optical receiver.

A need thus exists for an improved manner of controlling an offset signal range such as providing an extended slice adjust range.

SUMMARY OF THE INVENTION

In one aspect, the present invention is directed to an apparatus having a first amplifier stage to receive an input voltage and to provide an amplified output voltage at an output terminal, where the first amplifier stage is controlled by a first bias current. The apparatus may further include a second amplifier stage coupled to receive a control voltage and to provide an offset voltage to the output terminal, where the second amplifier stage is controlled by a second bias current. The first and second bias currents may be controlled by a bias controller which, in some embodiments may be integrated on a single substrate with the amplifier stages. The bias controller may be adapted to adjust the first and second bias currents based on a level of the control voltage. In some embodiments, the bias controller may include a multiplier to receive a sum bias current and to provide two adjustable output currents that are then applied to first and second current mirrors that in turn generate the first and second bias currents.

Another aspect of the present invention may be implemented in a method for controlling an amplifier. The method may be performed by receiving a control voltage corresponding to an offset level of the amplifier, generating first and second bias currents based on a level of the control voltage, and biasing a signal path of the amplifier using the first bias current and biasing an offset path of the amplifier using the second bias current.

The bias currents may be controlled, interdependently in some embodiments, based on the control voltage. As an example, the first bias and second bias currents may be adjusted while maintaining a constant sum of the currents.

Yet another aspect of the present invention may be realized in a limit amplifier that includes a signal path having a first amplifier stage to receive a data signal and provide an amplified data signal to an output terminal and a slice path having a second amplifier stage to receive a control signal and provide an amplified slice level to the output terminal. Each stage may be biased by respective bias currents generated in response to a level of the control signal. A bias controller may be adapted to generate the bias currents, and may include a multiplier, multiple current mirrors and multiple current sources, in some embodiments. The bias controller may interdependently control the bias currents, and a transconductance ratio of the second amplifier stage to the first amplifier stage can be controlled based on the control signal. Furthermore, the control signal may be controllable based on a level of the data signal.

In still other implementations, a limit amplifier in accordance with an embodiment of the present invention may be implemented in a system including a transimpedance amplifier (TIA) to generate an output voltage from an input current. Specifically, the limit amplifier may be coupled to an output of the TIA to amplify the output voltage. The system may further include a clock and data recovery (CDR) circuit coupled to receive the amplified output voltage.

Embodiments of the present invention may be implemented in appropriate hardware, firmware, and software. To that end, one embodiment may be implemented in a system for data transmission including a CDR or other circuitry, such as described above. Still other embodiments may include a system including such an integrated circuit along with additional components.

DETAILED DESCRIPTION

Figure 2:
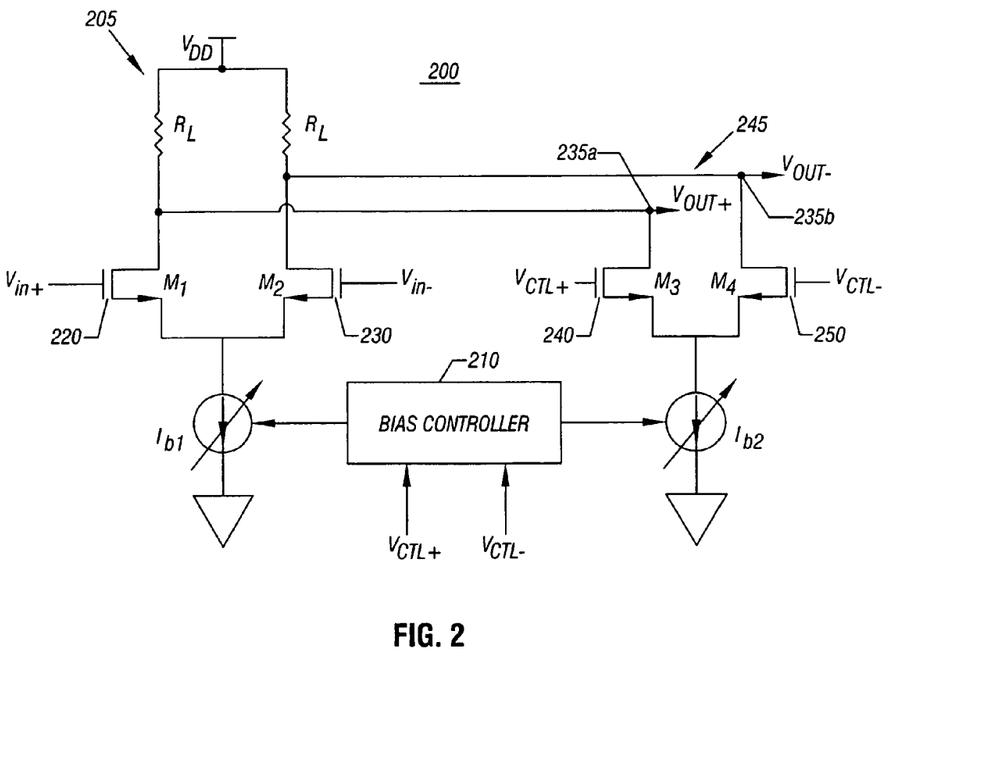
FIG. 2 is a schematic diagram of an amplifier in accordance with one embodiment of the present invention.

Referring now to FIG. 2, shown is a schematic diagram of an amplifier in accordance with one embodiment of the present invention. Amplifier 200 of FIG. 2 may be a limit amplifier used in an optical system, for example. In such an embodiment, amplifier 200 may be in a receive path of an optical receiver that receives incoming optical energy, converts the optical energy into electrical energy, and obtains a recovered clock and data therefrom. However, in other embodiments amplifier 200 may be used in other types of systems, and may also be a different type of amplifier, such as an instrumentation amplifier or a pre-amplifier.

As shown in FIG. 2, amplifier 200 includes a bias controller 210 that may be used to control a bias current for both a signal path and an offset path of the amplifier. Bias controller 210 may control the bias currents according to the level of a control signal. Specifically, this control signal is a signal used to control the offset path. In an embodiment in which amplifier 200 is a limit amplifier, this control signal may be used to generate a slice voltage to be added to the amplified signal.

Still referring to FIG. 2, amplifier 200 includes a pair of differential amplifiers. A first differential pair may form a signal amplifier stage 205 and a second differential pair may form an offset amplifier stage 245. While shown in the embodiment of FIG. 2 as being differential amplifiers, other embodiments may take the form of single-ended stages. Signal amplifier stage 205 includes a differential transistor pair formed of a first transistor (M1) 220 and a second transistor (M2) 230. As shown in FIG. 2, first transistor 220 and second transistor 230 may be metal-oxide-semiconductor field effect transistors (MOSFETs), and more specifically, n-channel MOSFETs.

As shown in FIG. 2, bias controller 210 is coupled to control both a first bias current, ib1, for controlling signal amplifier stage 205 and a second bias current, ib2, for controlling offset amplifier stage 245. The first bias current ib1 may provide a current to bias signal amplifier stage 205. More specifically, bias current ib1 may be coupled to a source terminal of MOSFETs 220 and 230. The gate terminals of MOSFETs 220 and 230 in turn receive the incoming voltage signal, $V_{in+}$ and $V_{in-}$, respectively received on an input terminal of amplifier 200. The drain terminals of MOSFETs 220 and 230 may be coupled to an output terminal of the amplifier 200 at a differential output node 235a and 235b. Furthermore, as shown in FIG. 2, a load resistance may be coupled to the drain terminals of MOSFETs 220 and 230 at the output nodes. Specifically, a pair of load resistances, $R_L$, may be coupled between a supply voltage ($V_{DD}$) and the drain terminals of MOSFETs 220 and 230.

Still referring to FIG. 2, offset amplifier stage 245 also may be controlled via bias controller 210. Specifically, as shown in FIG. 2, the second bias current, ib2, may bias offset amplifier stage 245. The second bias current ib2 may be coupled to sink a current that flows through a third transistor (M3) 240 and a fourth transistor (M4) 250, which may be MOSFETs. In the embodiment shown in FIG. 2, third MOSFET 240 and fourth MOSFET 250 may be n-channel MOSFETs, although the scope of the present invention is not so limited. The second bias current ib2 may be coupled to the source terminals of MOSFETs 240 and 250. The gate terminals of MOSFETs 240 and 250 may be coupled to receive a control voltage, $V_{CTL}$. The control voltage may be a control signal used to generate a desired input-referred offset value in signal amplifier stage 205. Specifically, in a limit amplifier the control voltage may be used to generate the desired slice offset to be added to the amplified incoming voltage. Accordingly, the drain terminals of MOSFETs 240 and 250 may coupled to the output terminal at nodes 235a and 235b to provide the offset voltage.

In various embodiments, bias controller 210 may control first and second bias currents according to the control voltage signal level. By controlling the bias currents in this manner, noise from offset amplifier stage 245 may be reduced. This is especially so in applications in which the control voltage is at a relatively small value. When however a large incoming voltage is present, the control voltage may be higher. While a higher control voltage may lead to greater noise in offset amplifier stage 245, because the signal amplitude of the incoming voltage and accordingly the output of signal amplifier stage 205 is greater, the signal to noise ratio may be uncompromised.

In some embodiments, bias controller 210 may operate to control the bias currents in an interdependent fashion. For example, bias controller 210 may increase a level of the second bias current and decrease a level of the first bias current when the control voltage is increased. In similar manner, bias controller 210 may increase the first bias current and decrease the second bias current when the control voltage is decreased. Such operation results in a small ratio between the transconductance of offset amplifier stage 245 to the transconductance of signal amplifier stage 205 when the control voltage is small. This gm3/gm1 may be between approximately 1:7 and 1:4, in some embodiments. Accordingly, there is a reduced noise contribution from the offset path. In contrast, a larger transconductance ratio between the stages may exist when the control voltage is large. For example, in some embodiments the gm3/gm1 ratio may be between 1:3 and 1:1.5 for a larger control voltage. Although the offset path noise may increase in these cases, the signal amplitude of the incoming voltage is higher, and thus the signal to noise ratio is uncompromised.

Figure 3:
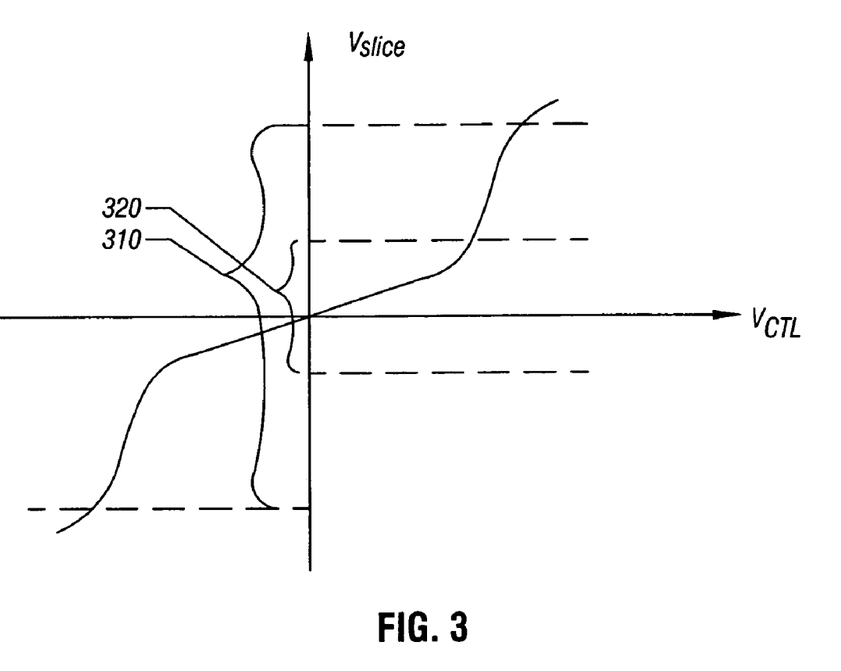
FIG. 3 is a transfer curve in accordance with an embodiment of the present invention.

By varying the transconductance ratios between the differential amplifier stages, an extended signal swing range for an offset voltage (e.g., a slice voltage) may be effected. Referring now to FIG. 3, shown is a transfer curve in accordance with an embodiment of the present invention. The transfer curve describes a slice voltage ($V_{slice}$) level for a given control voltage ($V_{CTL}$) level. More specifically, shown in FIG. 3 is a slice transfer curve in which an extended slice voltage is provided. Specifically, swing range 310 may be effected by controlling bias currents in accordance with an embodiment of the present invention. In contrast, only a limited swing range 320 of the prior art is achievable using a conventional biasing scheme. In such manner, a signal swing range may be extended by a factor of two using embodiments of the present invention.

There may be many different manners of implementing a bias control scheme in accordance with an embodiment of the present invention. In some embodiments, the bias control scheme may provide for a constant total bias current between a signal amplifier stage and an offset amplifier stage. However, the bias currents for each stage may be varied based on the control voltage provided for the offset amplifier stage. In such manner, the voltage drop from a supply voltage to an output node may remain constant for a given load resistance.

Figure 4:
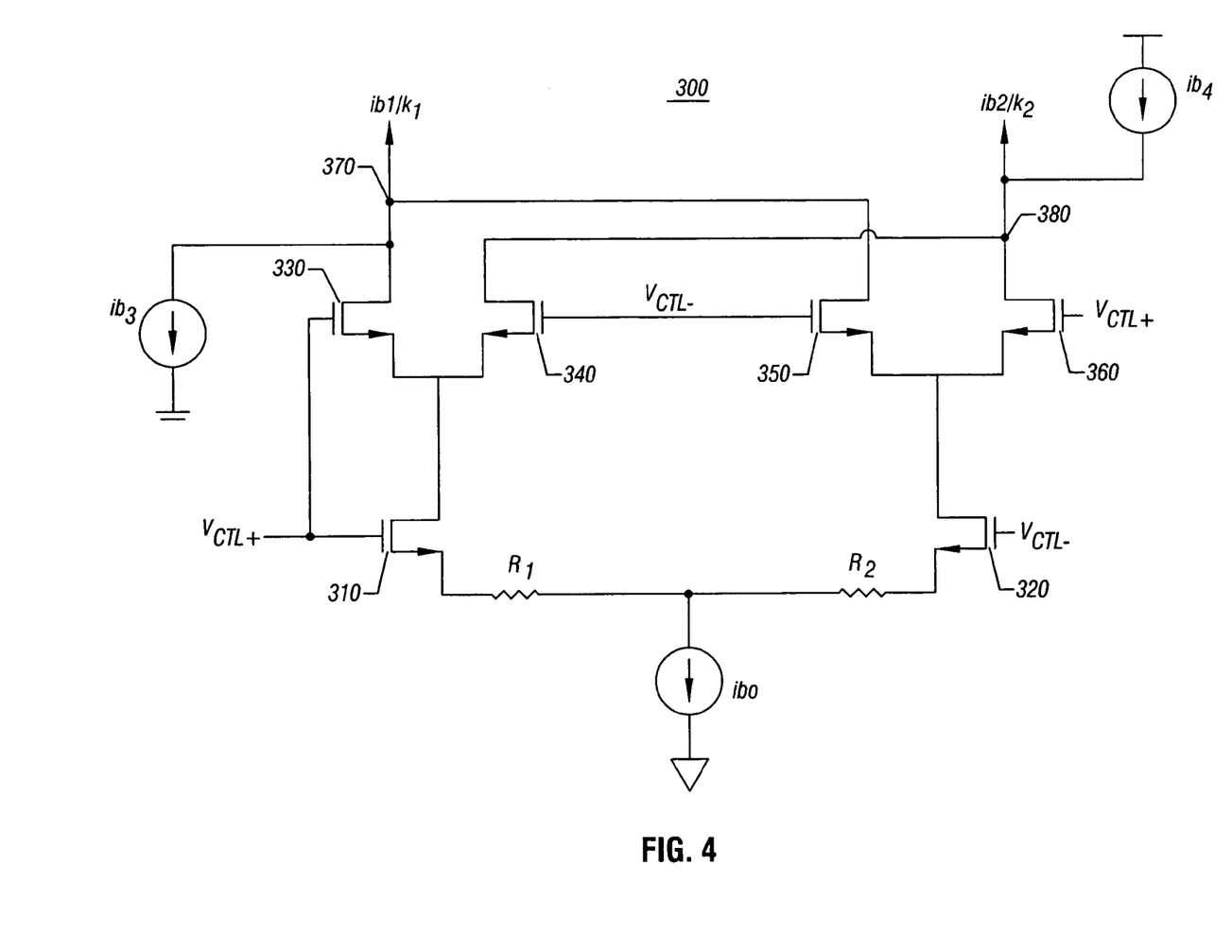
FIG. 4 is a schematic diagram of a portion of a bias controller in accordance with one embodiment of the present invention.

Referring now to FIG. 4, shown is a schematic diagram of a portion of a bias controller in accordance with one embodiment of the present invention. As shown in FIG. 4, circuit 300 may be based on a Gilbert multiplier. However it is to be understood that bias controllers may take different forms in different embodiments. In addition to a hardware implementation such as that shown in FIG. 4, in other embodiments a combination of hardware, software and/or firmware may be used to implement a biasing scheme to achieve an extended slice signal swing range.

As shown in FIG. 4, a current source, ib0, is coupled between a ground reference potential and a pair of resistances, R1 and R2. In turn, resistances R1 and R2 are coupled to source terminals of a first MOSFET 310 and a second MOSFET 320. The gate terminals of MOSFETs 310 and 320 are coupled to receive the control voltage, $V_{CTL}$. Specifically, as shown in FIG. 4 MOSFET 310, which may be an n-channel MOSFET, is coupled to receive a positive control voltage, $V_{CTL+}$, and an n-channel MOSFET 320 is coupled to receive a negative control voltage, $V_{CTL-}$. The positive control voltage is further coupled to the gate terminals of MOSFETs 330 and 360. As further shown in FIG. 4, the source terminals of MOSFETs 330 and 360 are coupled to the drain terminals of MOSFETs 310 and 320, which are further coupled to the source terminals of corresponding differential transistors 340 and 350. MOSFETs 340 and 350 have gate terminals coupled to receive the negative control voltage. Also as shown in FIG. 4, a current source, ib3, is coupled between a ground reference potential and drain terminals of MOSFETs 330 and 350, and a current source, ib4, is coupled between a supply voltage and drain terminals of MOSFETs 340 and 360.

The first bias current that is used to bias the signal amplifier stage may be obtained from a current present at an output terminal 370 that coupled to the drain terminals of MOSFETs 330, 350, and ib3. Similarly, the second bias current used to bias the offset amplifier stage may be obtained from a current present at an output terminal 380 that is coupled to the drain terminals of MOSFETs 340, 360, and ib4.

As will be described further below, the currents present at output terminals 370 and 380 are controlled based on the level of the control voltage being input. Furthermore, in some embodiments before being provided as the bias current to a signal amplifier stage and an offset amplifier stage, the currents present at output terminals 370 and 380 each may be coupled to respective current mirror networks, so that the currents may be boosted and a desired ratio between the bias currents can be achieved.

Still referring to FIG. 4, the current at output terminal 370 may be equal to the first bias current, ib1, divided by a current mirror ratio K1 (i.e., ib1/K1). In other words, the current mirror (not shown in FIG. 4) boosts the current present at output terminal 370 by the current mirror ratio K1. Similarly, the current at output terminal 380 corresponds to the second bias current, ib2, divided by a second current mirror ratio K2 (i.e., ib2/K2).

Still referring to FIG. 4, circuit 300 may operate to provide varied bias currents for signal and offset amplification paths to which it is coupled while maintaining a constant bias current sum. For example, where there is a zero differential between the positive and negative control voltages provided to circuit 300, the bias current ib0 of circuit 300 is evenly divided between output terminals 370 and 380. However, where the positive control voltage is larger than the negative control voltage, a significantly greater portion of the bias current ib0 is provided to output terminal 370 than to output terminal 380. Circuit 300 operates vice versa when the negative control voltage is greater than the positive control voltage. In one embodiment, current sources ib3 and ib4 are of substantially the same value, providing an initial current difference between the currents flowing out terminal 370 and terminal 380 when the differential control voltage is zero. For example, in one implementation ib0 is 400 microamperes ($\mu$A), and ib3 and ib4 are 150 $\mu$A. A zero differential control voltage divides ib0 evenly into two 200 $\mu$A currents flowing out of terminal 370 and 380. Adding the effects of ib3 and ib4, the total current flowing out of terminal 370 is 350 $\mu$A, and the total current flowing out of terminal 380 is 50 $\mu$A. This provides a bias current ratio between ib1 and ib2 of 7:1 when the differential control voltage is zero.

The current mirror networks coupled to output terminals 370 and 380 increase the levels of the first and second bias currents, while saving current within circuit 300. In some embodiments, a current mirror ratio of between approximately 1:20 and 1:4 may be provided. The current mirror ratio of the respective networks may be equal or may be different, in various embodiments. In one embodiment, the current mirror ratio K1 and K2 are of the same value to achieve constant total current sum.

Figure 5:
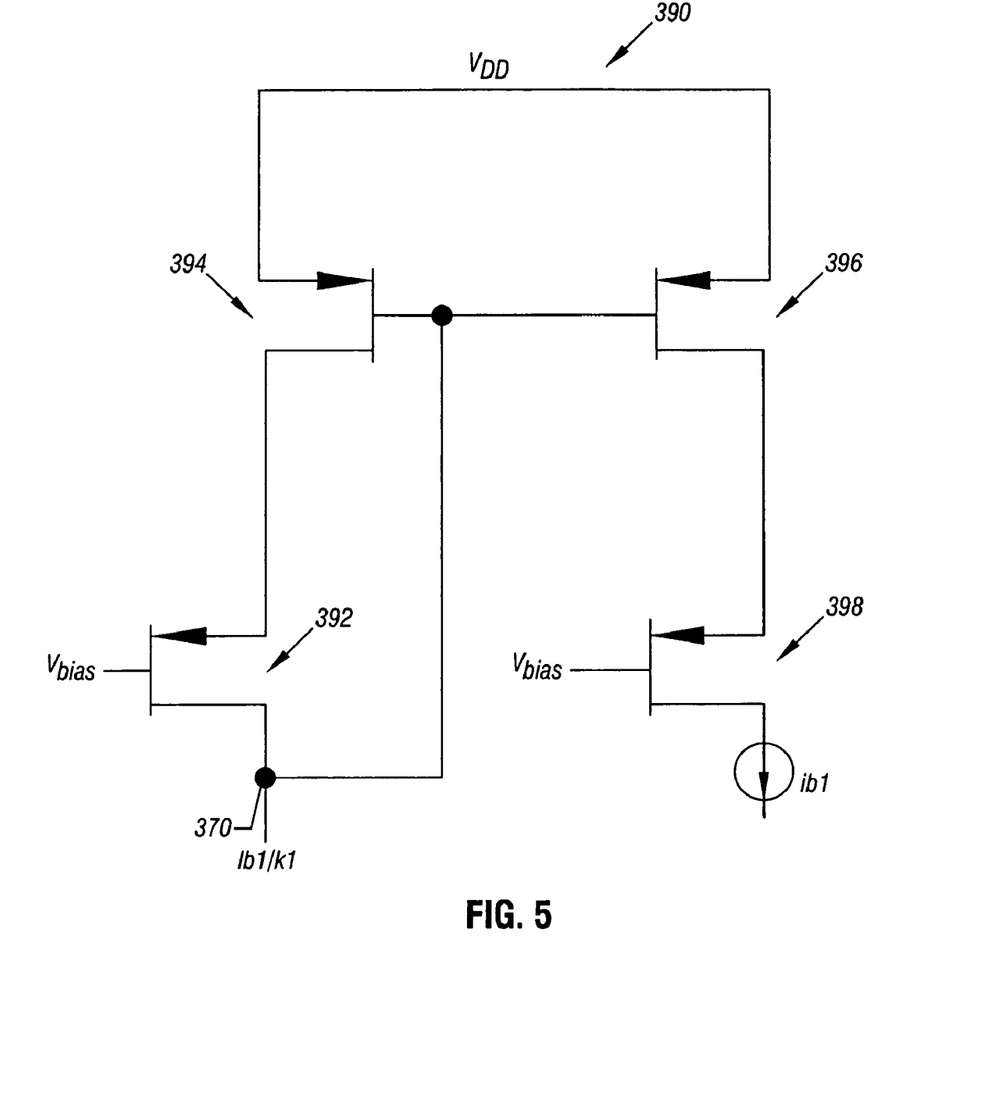
FIG. 5 is a schematic diagram of a current mirror circuit in accordance with one embodiment of the present invention.

Referring now to FIG. 5, shown is a schematic diagram of a current mirror circuit that may be part of a bias controller in accordance with one embodiment of the present invention. As shown in FIG. 5, current mirror 390 may be used to boost the current at output terminal 370 of circuit 300 to a boosted level corresponding to the first bias current ib1.

As shown in FIG. 5, current mirror 390 includes a first transistor 392 having a drain terminal coupled to output terminal 370. As shown in FIG. 5, first transistor 392 may be a MOSFET, specifically a p-channel MOSFET (pMOSFET), although the scope of the present invention is not so limited. First transistor 392 is controlled by a bias voltage, $V_{bias}$. First transistor 392 has a source terminal coupled to a gate terminal of a second transistor 394, which may also be a pMOSFET. Second transistor 394 has a source terminal coupled to a supply voltage, $V_{DD}$. The supply voltage is also coupled to a source terminal of a third transistor 396, also shown in FIG. 5 as a pMOSFET. Second transistor 394 and third transistor 396 have gate terminals coupled to output terminal 370. In turn, a drain terminal of third transistor 396 is coupled to a source terminal of a fourth transistor 398, which may also be a pMOSFET. Fourth transistor 398 is also controlled by the bias voltage, $V_{bias}$, at its gate terminal. The drain terminal of fourth transistor 398 thus provides the boosted current, ib1.

In various embodiments, first transistor 392 and fourth transistor 398 may be of a substantially similar size, and second transistor 392 and third transistor 396 may be of a substantially similar size. Further, second transistor 394 and third transistor 396 may be of a much greater size than first transistor 392 and fourth transistor 398. In such manner, current mirror 390 boosts the current present at terminal 370 to the bias current for use in an amplifier. In various embodiments, the ratio between the top transistors (i.e., transistors 394 and 396) and the bottom transistors (i.e., transistors 392 and 398) may be between approximately 1:25 and 1:4, although the scope of the present invention is not so limited.

While the current mirror circuit shown in FIG. 5 may be used to generate the first bias current, it is to be understood that a similar current mirror circuit may be used to generate the second bias current. In some embodiments, the first bias current may be generated at levels between approximately 2000 microamperes ($\mu$A) and 3500 $\mu$A, while the second bias current may have levels between approximately 500 $\mu$A and 2000 $\mu$A. Accordingly, using a circuit such as circuit 300 in addition to current mirrors such as that shown in FIG. 5, first and second bias currents may be interdependently controlled to provide bias currents to an amplifier with values that total a predetermined sum amount (e.g., 4000 $\mu$A, when the current mirrors provide a 10× boosting level (i.e., when K1 and K2 both equal 10) for a 400 $\mu$A 1b0 current).

The control voltage may be obtained from various sources in different systems. For example, in some embodiments the control voltage may be obtained from a digital to analog converter (DAC) that is coupled to receive a digital control word from a processor, such as a microcontroller. In other embodiments, a servo loop at a system level may feed back information regarding a BER of the receiver. Based on a comparison of the current BER to a target BER, a control voltage may be provided to enable a desired slice level.

As discussed, the ratio between the transconductances of the signal amplifier stage and the offset amplifier stage may vary based upon the control voltage level. More specifically, because the control voltage can be adjusted based on the input signal level, the transconductance ratio may vary based upon the input signal level. For example, in one embodiment if the incoming signal is at a level of 100 mV, a particular implementation may control the control voltage to generate a slice voltage of 20 mV. In such an embodiment, a transconductance ratio of gm3/gm1 may be very small. For example, at such a level the transconductance of the signal amplifier stage may be much greater than the transconductance of the offset amplifier stage, with a ratio of 5:1, for example.

However, if the incoming signal is at a much larger level, for example 500 mV, very little signal amplification is needed. Accordingly, in some embodiments a much larger transconductance ratio of the offset amplifier stage to the signal amplifier stage may be present. For example, in some implementations gm3 may equal or even be greater than gm1 when an incoming signal needs little amplification. While discussed herein with transconductance values for transistors M1 and M3, it is to be understood that in differential implementations, transistors of the signal amplifier stage may be substantially equal and transconductances of the offset amplifier stage may similarly be substantially equal.

Figure 6:
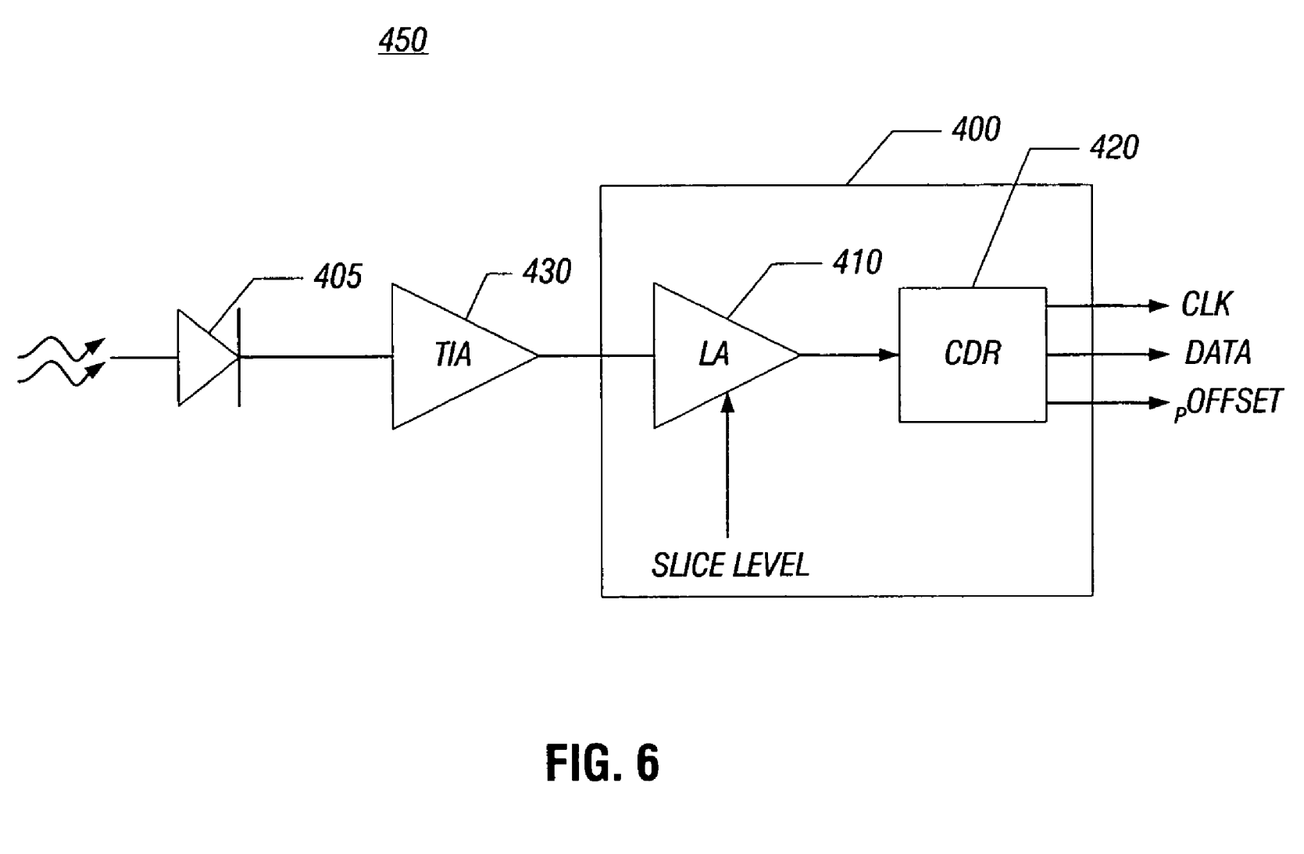
FIG. 6 is a block diagram of a system in accordance with one embodiment of the present invention.

Referring now to FIG. 6, shown is a block diagram of a portion of a system in accordance with one embodiment of the present invention. System 450 may be a part of an optical system, such as an optical receiver. As shown in FIG. 6, system 450 receives incoming optical signals, which may be obtained from an optical fiber or other such source via a photodetector 405, which converts the incoming optical energy into an electrical current. Then, a transimpedance amplifier (TIA) 430 converts the electrical current into voltage signals. From the output of TIA 430, voltage signals are provided to an integrated circuit 400 as an incoming data stream. As shown in FIG. 6, integrated circuit 400 may include a LA 410 in accordance with an embodiment of the present invention and a CDR 420. Specifically, the incoming data may be provided to LA 410 for amplification. As shown in FIG. 6, a slice level offset signal (slice level) may be provided to give a desired offset adjustment value to limit amplifier 410. Based on the slice level (which may itself depend on the strength of the incoming signal), bias currents for a signal amplifier stage and a slice amplifier stage of LA 410 may be controlled interdependently.

The output of LA 410 is provided to CDR 420. In turn, CDR 420 may generate outputs including recovered data (DATA) as well as a recovered clock signal (CLK), along with a phase offset signal (pOffset) which may report on the signal quality.

While shown with the particular components present in FIG. 6, it is to be understood that a system in accordance with an embodiment of the present invention may include additional components, and the components present in FIG. 6 may be differently arranged. For example, while integrated circuit 400 is shown to include a LA and a CDR, such components may be in different packages in other embodiments and, of course, additional components may be present in integrated circuit 400.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
   a first amplifier stage to receive an input voltage and to provide an amplified output voltage at an output terminal, the first amplifier stage controlled by a first bias current;
   a second amplifier stage coupled to receive a control voltage and to provide an offset voltage to the output terminal, the second amplifier stage controlled by a second bias current; and
   a bias controller coupled to receive the control voltage and to adjust the first bias current and the second bias current based on a level of the control voltage provided to the second amplifier stage.

2. The apparatus of claim 1, wherein the bias controller is to interdependently adjust the first bias current and the second bias current.

3. The apparatus of claim 1, wherein the bias controller is to increase the first bias current and decrease the second bias current if the control voltage is reduced.

4. The apparatus of claim 1, wherein the apparatus comprises a limit amplifier and the control voltage is to control a slice level voltage of the limit amplifier.

5. The apparatus of claim 1, wherein a transconductance ratio of the second amplifier stage to the first amplifier stage is variable based on a level of the input voltage.

6. The apparatus of claim 1, wherein the bias controller comprises:
   a multiplier to receive a sum bias current and to provide an adjustable first output current and an adjustable second output current that equal the sum bias current based on a level of the control voltage;
   a first current mirror coupled to receive the first adjustable output current and to generate the first bias current therefrom; and
   a second current mirror coupled to receive the second adjustable output current and to generate the second bias current therefrom.

7. A method comprising:
   receiving a control voltage corresponding to an offset level of an amplifier;
   generating a first bias current and a second bias current based on a level of the control voltage;
   biasing a signal path of the amplifier using the first bias current; and
   biasing an offset path of the amplifier using the second bias current.

8. The method of claim 7, further comprising increasing the second bias current if the control voltage increases.

9. The method of claim 7, wherein generating the first bias current and the second bias current comprises decreasing the first bias current and increasing the second bias current if the control voltage increases.

10. A method comprising:
    receiving a control voltage corresponding to an offset level of an amplifier;
    generating a first bias current and a second bias current based on a level of the control voltage, including receiving a sum bias current and based on the level of the control voltage, providing a first portion of the sum bias current to a first current booster to generate the first bias current and a second portion of the sum bias current to a second current booster to generate the second bias current, where the first portion and the second portion equal the sum bias current;
    biasing a signal path of the amplifier using the first bias current; and
    biasing an offset path of the amplifier using the second bias current.

11. The method of claim 7, wherein the amplifier comprises a limit amplifier and the control voltage corresponds to a slice level.

12. The method of claim 7, further comprising inputting the control voltage to the offset path of the amplifier to generate the offset level.

13. The method of claim 7, further comprising adjusting the first bias current and the second bias current while maintaining a constant sum of the first bias current and the second bias current.

14. The method of claim 7, further comprising reducing the first bias current if an incoming signal to the signal path of the amplifier increases.

15. A limit amplifier comprising:
    a signal path including a first amplifier stage to receive a data signal and provide an amplified data signal to an output terminal;
    a slice path including a second amplifier stage to receive a control signal and provide an amplified slice level to the output terminal; and
    wherein the first amplifier stage is biased by a first bias current generated in response to a level of the control signal, and the second amplifier stage is biased by a second bias current generated in response to the level of the control signal.

16. The limit amplifier of claim 15, further comprising a bias controller to generate the first bias current and the second bias current.

17. The limit amplifier of claim 16, wherein the bias controller comprises:
    a multiplier to receive a sum bias current and to provide a first output current and a second output current;

a first current mirror coupled to receive the first output current and to generate the first bias current therefrom; and a second current mirror coupled to receive the second output current and to generate the second bias current therefrom.

18. The limit amplifier of claim 17, further comprising:

a first current source coupled to the multiplier and the first current mirror; and a second current source coupled to the multiplier and the second current mirror, wherein the first current source and the second current source are to provide an initial current difference between the first output current and the second output current.

19. The limit amplifier of claim 16, wherein the bias controller is to interdependently control the first bias current and the second bias current.

20. The limit amplifier of claim 15, wherein a transconductance ratio of the second amplifier stage to the first amplifier stage is controllable based on the control signal.

21. The limit amplifier of claim 15, wherein the control signal is controllable based on a level of the data signal.

22. A system comprising:

a transimpedance amplifier (TIA) to generate an output voltage from an input current;

a limit amplifier coupled to an output of the TIA, the limit amplifier comprising:

a first amplifier stage to receive the output voltage and to provide an amplified output voltage at an output terminal, the first amplifier stage controlled by a first bias current;

a second amplifier stage coupled to receive a control voltage and to provide an offset voltage to the output terminal, the second amplifier stage controlled by a second bias current; and a bias controller to adjust the first bias current and the second bias current; and a clock and data recovery circuit coupled to receive the amplified output voltage.

23. The system of claim 22, wherein the bias controller is to interdependently adjust the first bias current and the second bias current based on a level of the control voltage.

24. The system of claim 22, wherein a transconductance ratio of the second amplifier stage to the first amplifier stage is controllable based on the control voltage.

* * * * *